United States Patent
Lee et al.

(10) Patent No.: US 11,004,519 B2
(45) Date of Patent: May 11, 2021

(54) STORAGE DEVICE AND OPERATING METHOD THEREOF

(71) Applicant: SK hynix Inc., Gyeonggi-do (KR)

(72) Inventors: Seon Ju Lee, Gyeonggi-do (KR); Min Hwan Moon, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/696,508

(22) Filed: Nov. 26, 2019

(65) Prior Publication Data
US 2021/0065815 A1 Mar. 4, 2021

(30) Foreign Application Priority Data
Aug. 26, 2019 (KR) .................. 10-2019-0104706

(51) Int. Cl.
| | |
|---|---|
| G06F 11/10 | (2006.01) |
| G11C 29/52 | (2006.01) |
| G11C 29/04 | (2006.01) |
| H04L 1/00 | (2006.01) |
| H03M 13/00 | (2006.01) |
| H03M 13/11 | (2006.01) |
| G11C 16/26 | (2006.01) |
| G11C 16/34 | (2006.01) |
| G11C 16/04 | (2006.01) |
| G11C 11/56 | (2006.01) |

(52) U.S. Cl.
CPC .......... *G11C 16/26* (2013.01); *G06F 11/1068* (2013.01); *G11C 29/52* (2013.01); *G11C 11/5671* (2013.01); *G11C 16/0483* (2013.01); *G11C 16/3459* (2013.01)

(58) Field of Classification Search
CPC ..... G11C 16/26; G11C 29/52; G11C 11/5671; G11C 16/0483; G11C 16/3459; G06F 11/1068
See application file for complete search history.

(56) References Cited

U.S. PATENT DOCUMENTS

| | | | |
|---|---|---|---|
| 2007/0030729 A1* | 2/2007 | Chan ..................... | G11C 16/28 365/185.2 |
| 2011/0096612 A1* | 4/2011 | Steiner ................ | G11C 11/5642 365/189.09 |
| 2012/0057398 A1* | 3/2012 | Ouchi .................. | G11C 11/413 365/154 |
| 2015/0332778 A1* | 11/2015 | Kim ..................... | G11C 16/349 365/185.18 |

(Continued)

FOREIGN PATENT DOCUMENTS

| KR | 10-2014-0091955 | 7/2014 |
|---|---|---|
| KR | 10-2016-0055309 | 5/2016 |

*Primary Examiner* — Guy J Lamarre
(74) *Attorney, Agent, or Firm* — IP & T Group LLP

(57) ABSTRACT

A memory controller having improved read performance controls a memory device including a plurality of memory cells. The memory controller includes a read operation controller, a history bias storage, and a read voltage setting circuit. The read operation controller read data stored selected memory cells among the plurality of memory cells. The history bias storage stores a plurality of history mean biases, which are mean biases of a plurality of threshold voltage distributions that the plurality of memory cells have, and a plurality of reference cell count values respectively corresponding to the plurality of threshold voltage distributions.

20 Claims, 16 Drawing Sheets

(56) References Cited

U.S. PATENT DOCUMENTS

2017/0206979 A1* 7/2017 Cohen ................... G11C 29/028
2018/0068736 A1* 3/2018 Kim ...................... G11C 29/028
2018/0277222 A1* 9/2018 Kondo ............... G11C 16/3481

* cited by examiner

FIG. 8

|  | HISTORY MEAN BIAS | REFERENCE CELL COUNT VALUE | CELL COUNT VALUE | THRESHOLD RANGE DETERMINATION (Th=25) |
|---|---|---|---|---|
| FIRST THRESHOLD VOLTAGE DISTRIBUTION | m_a0 → m_a1 | 250 | 280 | ABNORMAL(30>Th) |
| SECOND THRESHOLD VOLTAGE DISTRIBUTION | m_b0 → m_b1 | 750 | 785 | ABNORMAL(35>Th) |

FIG. 10

|  | HISTORY MEAN BIAS | REFERENCE CELL COUNT VALUE | CELL COUNT VALUE | THRESHOLD RANGE DETERMINATION (Th=25) |
|---|---|---|---|---|
| FIRST THRESHOLD VOLTAGE DISTRIBUTION | m_a1 → m_a2 | 250 | 270 | NORMAL(20≤Th) |
| SECOND THRESHOLD VOLTAGE DISTRIBUTION | m_b1 → m_b2 | 750 | 775 | NORMAL(25≤Th) |

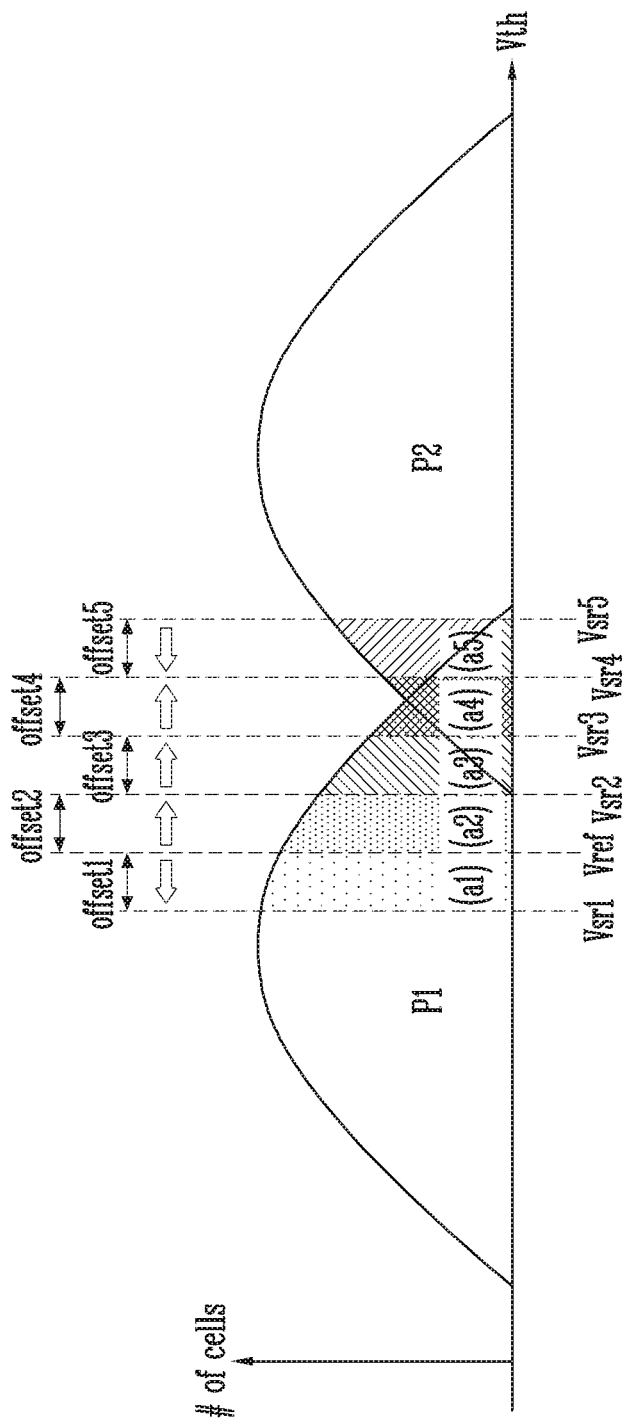

FIG. 12

HISTORY BIAS STORAGE (220)

| PLANE | HISTORY MEAN BIAS | | | | REFERENCE CELL COUNT VALUE |
|---|---|---|---|---|---|
| | PL1 | | PL2 | | |
| MEMORY BLOCK | BLK1 | BLK2 | BLK3 | BLK4 | |
| FIRST THRESHOLD VOLTAGE DISTRIBUTION | m_11 | m_12 | m_13 | m_14 | 125 |
| SECOND THRESHOLD VOLTAGE DISTRIBUTION | m_21 | m_22 | m_23 | m_24 | 375 |
| THIRD THRESHOLD VOLTAGE DISTRIBUTION | m_31 | m_32 | m_33 | m_34 | 625 |
| FOURTH THRESHOLD VOLTAGE DISTRIBUTION | m_41 | m_42 | m_43 | m_44 | 875 |

FIG. 13

HISTORY BIAS STORAGE (220)

| PLANE | HISTORY MEAN BIAS | | REFERENCE CELL COUNT VALUE |
|---|---|---|---|
| | PL1 | PL2 | |
| FIRST THRESHOLD VOLTAGE DISTRIBUTION | m_11' | m_12' | 125 |
| SECOND THRESHOLD VOLTAGE DISTRIBUTION | m_21' | m_22' | 375 |
| THIRD THRESHOLD VOLTAGE DISTRIBUTION | m_31' | m_32' | 625 |
| FOURTH THRESHOLD VOLTAGE DISTRIBUTION | m_41' | m_42' | 875 |

STORAGE DEVICE AND OPERATING METHOD THEREOF

CROSS-REFERENCE TO RELATED APPLICATION

The present application claims priority under 35 U.S.C. § 119(a) to Korean patent application number 10-2019-0104706 filed on Aug. 26, 2019, which is incorporated herein by reference in its entirety.

BACKGROUND

1. Field of Invention

The present disclosure generally relates to an electronic device, and more particularly, to a storage device and an operating method thereof.

2. Description of Related Art

A storage device is a configured to store data under the control of a host device, such as a computer or a smart phone. The storage device may include a memory device for storing data and a memory controller for controlling the memory device. The memory device may be a volatile memory device or a nonvolatile memory device.

The volatile memory device is a memory device in which data is stored only when power is supplied, and stored data disappears when the supply of power is interrupted. Examples of a volatile memory device include a Static Random Access Memory (SRAM), a Dynamic Random Access Memory (DRAM), and the like.

The nonvolatile memory device is a memory device which has a capability to hold stored data even when the supply of power is interrupted. Examples of a nonvolatile memory device include a Read Only Memory (ROM), a Programmable ROM (PROM), an Electrically Programmable ROM (EPROM), an Electrically Erasable ROM (EPROM), a flash memory, and the like.

SUMMARY

Embodiments provide a storage device having improved read performance and an operating method thereof.

In accordance with an embodiment, there is provided a memory controller for controlling a memory device including a plurality of memory cells, the memory controller including: a read operation controller configured to read data stored in selected memory cells among the plurality of memory cells; a history bias storage configured to store a plurality of history mean biases, which are mean biases of a plurality of threshold voltage distributions that the plurality of memory cells have, and a plurality of reference cell count values respectively corresponding to the plurality of threshold voltage distributions; and a read voltage setting circuit configured to calculate difference values between cell count values that are numbers of memory cells read as first memory cells by the plurality of history mean biases among the selected memory cells and the plurality of reference cell count values, when the read operation fails, and determine an adjusted read voltage to read the selected memory cells, based on the plurality of history mean bias, according to whether the difference values are within a threshold range, wherein the plurality of reference cell count values is determined based on a number of the selected memory cells and a number of the plurality of threshold voltage distributions.

In accordance with another embodiment, there is provided a method for operating a storage device including a memory device including a plurality of memory cells and a memory controller for controlling the memory device, the method including: storing information on a plurality of history mean biases that are mean biases of a plurality of threshold voltage distributions that the plurality of memory cells have; performing a read operation on selected memory cells among the plurality of memory cells; comparing cell count values that are numbers of memory cells read as first memory cells by the plurality of history mean biases among the selected memory cells with a plurality of reference cell count values respectively corresponding to the plurality of threshold voltage distributions, when the read operation fails; and determining an adjusted read voltage, based on the plurality of history mean biases, according to whether difference values between the cell count values and the plurality of reference cell count values are within a threshold range, wherein the plurality of reference cell count values is determined based on a number of the selected memory cells and a number of the plurality of threshold voltage distributions.

In accordance with an embodiment, there is provided memory system comprising a memory device configured to supply a read voltage to a plurality of memory cells and output data stored in the plurality of memory cells; a controller configured to estimate threshold voltages of the plurality of memory cells, wherein, when the data is successfully recognized, the controller is configured to reflect a representative value of the threshold voltages in a tracked bias, otherwise, the controller is configured to determine how to use the tracked bias for adjusting a level of the read voltage, based on whether differences between the threshold voltages and reference threshold voltages are acceptable.

BRIEF DESCRIPTION OF THE DRAWINGS

Various embodiments are described more fully below with reference to the accompanying drawings; however, the present invention may be embodied in different forms and should not be construed as limited to the embodiments set forth herein. Rather, these embodiments are provided so that this disclosure is thorough and complete and fully convey the scope of the embodiments to those skilled in the art.

In the drawing figures, dimensions may be exaggerated for clarity of illustration. Like reference numerals refer to like elements throughout.

FIG. 8 is a diagram illustrating the history mean biases shown in FIG. 7 and threshold range determination.

FIG. 10 is a diagram illustrating the history mean biases shown in FIG. 9 and threshold range determination.

FIG. 11 is a diagram illustrating optimum read voltage calculation using a soft read scheme in accordance with an embodiment of the present disclosure.

FIG. 12 is a diagram illustrating a history bias storage shown in FIG. 5 in accordance with an embodiment of the present disclosure.

FIG. 13 is a diagram illustrating the history bias storage shown in FIG. 5 in accordance with another embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, various embodiments of the present disclosure are described in detail with reference to the accompanying drawings to enable those skilled in the art to readily implement and practice the present invention.

Figure 1:
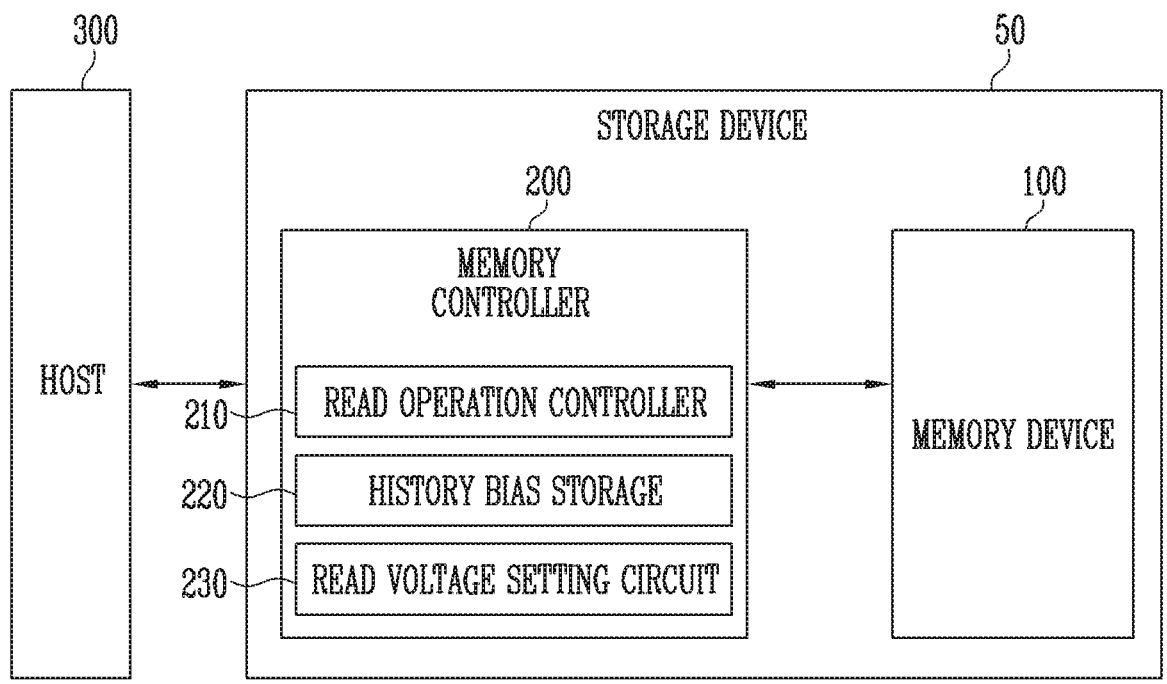
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host 300, such as a mobile phone, a smart phone, an MP3 player, a laptop computer, a desktop computer, a game console, a TV, a tablet PC or an in-vehicle infotainment.

The storage device 50 may be implemented as any one of various types of storage devices according to a host interface that is a communication scheme with the host 300. For example, the storage device 50 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be embodied in any of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a single level cell (SLC) storing one-bit data, a multi-level cell (MLC) storing two-bit data, a triple level cell (TLC) storing three-bit data, or a quad level cell (QLC) storing four-bit data.

The memory cell array may include a plurality of memory blocks. Each memory block may include a plurality of pages. One page may include a plurality of memory cells. In an embodiment, the page may be a group of memory cells in which data is stored or data is read from.

The memory block may be a group of memory cells in which data is erased together. In an embodiment, the memory device 100 may include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, the memory device 100 includes a NAND flash memory.

The memory device 100 receives a command and an address which are inputted from the memory controller 200 and accesses a physical location indicated by the address in the memory cell array. That is, the memory device 100 may perform an operation instructed by the command on the physical location selected by the address. For example, the memory device 100 may perform a write (program) operation, a read operation, and/or an erase operation. In the program operation, the memory device 100 may program data in the physical location indicated by the address. In the read operation, the memory device 100 may read data from the physical location indicated by the address. In the erase operation, the memory device 100 may erase data stored in the physical location indicated by the address.

The memory controller 200 may control overall operations of the storage device 50.

When power is applied to the storage device 50, the memory controller 200 may execute firmware (FW). When the memory device 100 a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing a location of memory cells included in the memory device 100, in which data is to be stored.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may independently generate a command, an address, or data, regardless of a request inputted from the host 300, and transmit the command, the address, and the data to the memory device 100. For example, the memory controller 200 may provide the command, the address, and the data to the memory device 100 to perform a background operation such as a read or program operation for wear leveling or garbage collection.

In an embodiment, the memory controller 200 may control at least two memory devices 100. The memory controller 200 may control the at least two memory devices 100 according to an interleaving scheme to improve operational performance. The interleaving scheme may allow operating sections of the at least two memory devices 100 to overlap with each other. Operations can be parallel or individually performed within each of the at least two memory devices 100 so that the operating sections (or margins) of the operations may be overlapped.

In an embodiment, the memory controller 200 may include a read operation controller 210, a history bias storage 220, and a read voltage setting circuit 230.

The read operation controller 210 may control the memory device 100 to read data stored in selected memory cells among the memory cells included in the memory device 100. Specifically, the read operation controller 210 may control the memory device 100 to read the selected memory cells coupled to a selected word line by applying a read voltage to the selected word line. The read operation controller 210 may receive a read voltage from the read voltage setting circuit 230 and supply the read voltage to the selected word line.

When an operation of using a default read voltage to read data stored in memory cells coupled via a selected word line fails, the read operation controller 210 may control the memory device 100 to use a different read voltage such as an optimum (i.e. adjusted) read voltage to read data stored in memory cells coupled via the selected word line.

The history bias storage 220 may store information regarding a plurality of history mean biases. The history mean biases may include mean bias in a plurality of threshold voltages distributions that a plurality of memory cells has. In an embodiment, the plurality of history mean biases may be mean biases in threshold voltages distributions that a plurality of memory cells has, in a read operation that has most recently succeeded among plural read operations performed on the same plane or the same memory block.

For example, the plurality of history mean biases may be associated with a single memory block including a plurality of memory cells. Therefore, the history bias storage 220 may store history mean biases corresponding to each memory block. Alternatively, the plurality of history mean biases may be associated with a single plane including a plurality of memory cells. Therefore, the history bias storage 220 may store history mean biases corresponding to each plane.

When a read operation regarding a specific location passes (e.g., succeeds), the history bias storage 220 may recognize threshold voltages to update history mean biases, stored before the read operation passes, based on mean biases recognized when the read operation passes, and store the updated mean biases.

The history bias storage 220 may store a plurality of reference cell count values respectively corresponding to a plurality of history mean biases. The plurality of reference cell count values may be determined according to the number of selected memory cells coupled to a selected word line and the number of threshold voltage distributions corresponding to the plurality of history mean biases.

The read voltage setting circuit 230 may provide the read operation controller 210 with information regarding a read voltage applied to a selected word line in a read operation.

The read voltage setting circuit 230 may determine an optimum read voltage, when a read operation using a default read voltage fails. The read voltage setting circuit 230 may determine the optimum read voltage by using a plurality of history mean biases or a soft read scheme.

The read voltage setting circuit 230 may compare cell count values with a plurality of history mean biases. The cell count values are the numbers of memory cells considered first memory cells based on the plurality of history mean biases, among memory cells coupled to the selected word line. The plurality of reference cell count values respectively corresponds to a plurality of history mean biases. The first memory cell may be either an on-cell or an off-cell. For example, when the first memory cell is an on-cell, the set logical value may be '1.' When the first memory cell is an off-cell, the set logical value may be '0.'

The read voltage setting circuit 230 may calculate difference values between the cell count values that are the numbers of memory cells as the first memory cells and the plurality of reference cell count values, and determine an optimum read voltage by using the plurality of history mean biases or the soft read scheme, based on a result obtained by comparing the difference values with a threshold range.

When the difference values are within the threshold range, the read voltage setting circuit 230 may determine an optimum read voltage based on the plurality of history mean biases. When the difference values are out of the threshold range, the read voltage setting circuit 230 may use the soft read scheme to determine an optimum read voltage. How to determine the optimum read voltage is described below with reference to FIG. 11.

The read voltage setting circuits 230 may provide the read operation controller 210 with information on the determined optimum read voltage.

When a read operation using the optimum read voltage succeeds, the read voltage setting circuit 230 may update the history mean biases stored in the history bias storage 220. The read voltage setting circuit 230 may update the history mean biases stored in the history bias storage 220 by using mean biases in threshold voltages distributions that memory cells, coupled to a selected word line when the read operation succeeds, have.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
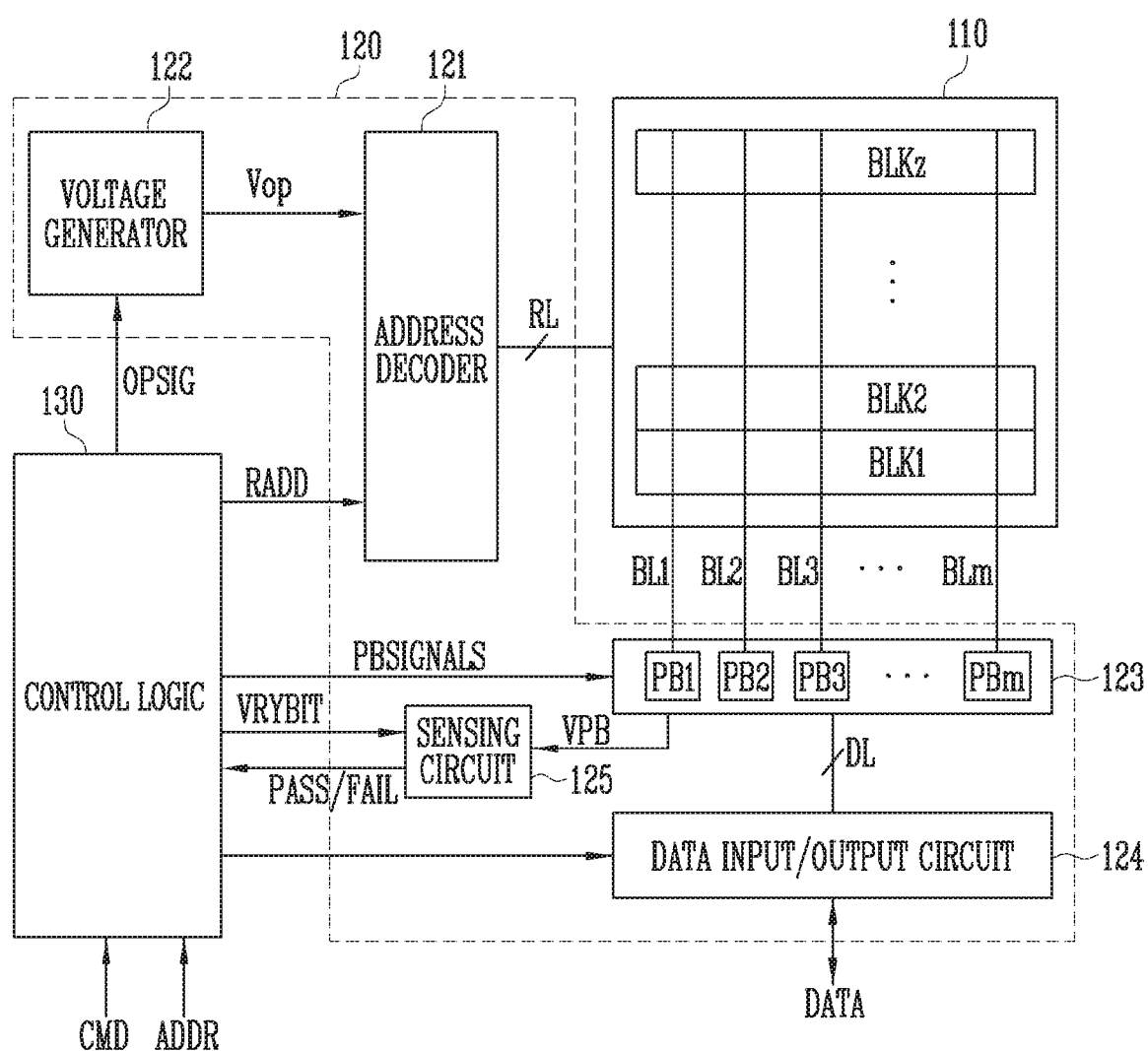
FIG. 2 is a diagram illustrating a structure of a memory device shown in FIG. 1.

FIG. 2 is a diagram illustrating a structure of a memory device shown in FIG. 1.

Referring to FIG. 2, the memory device 100 may include a memory cell array 100, a peripheral circuit 120, and a control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells coupled to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be coupled in series between a drain select transistor and memory cells and between a source select transistor and the memory cells.

Each of the memory cells of the memory device may be configured as a Single Level Cell (SLC) storing one-bit data, a Multi-Level Cell (MLC) storing two-bit data, a Triple Level Cell (TLC) storing three-bit data, or a Quad Level Cell (QLC) storing four-bit data.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

In an embodiment, the row lines RL may be local lines included in local line groups. Each local line group may correspond to one memory block. The local line group may include a drain select line, local word lines, and a source select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address RADD in the received address ADDR. The address decoder 121 may select at least one word line of the selected memory block by applying voltages provided from the voltage generator 122 to the word line WL according to the decoded row address RADD.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

To generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated voltages Vop may be supplied to the memory cell array 110 by the address decoder 121.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or a verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be coupled to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

Figure 3:
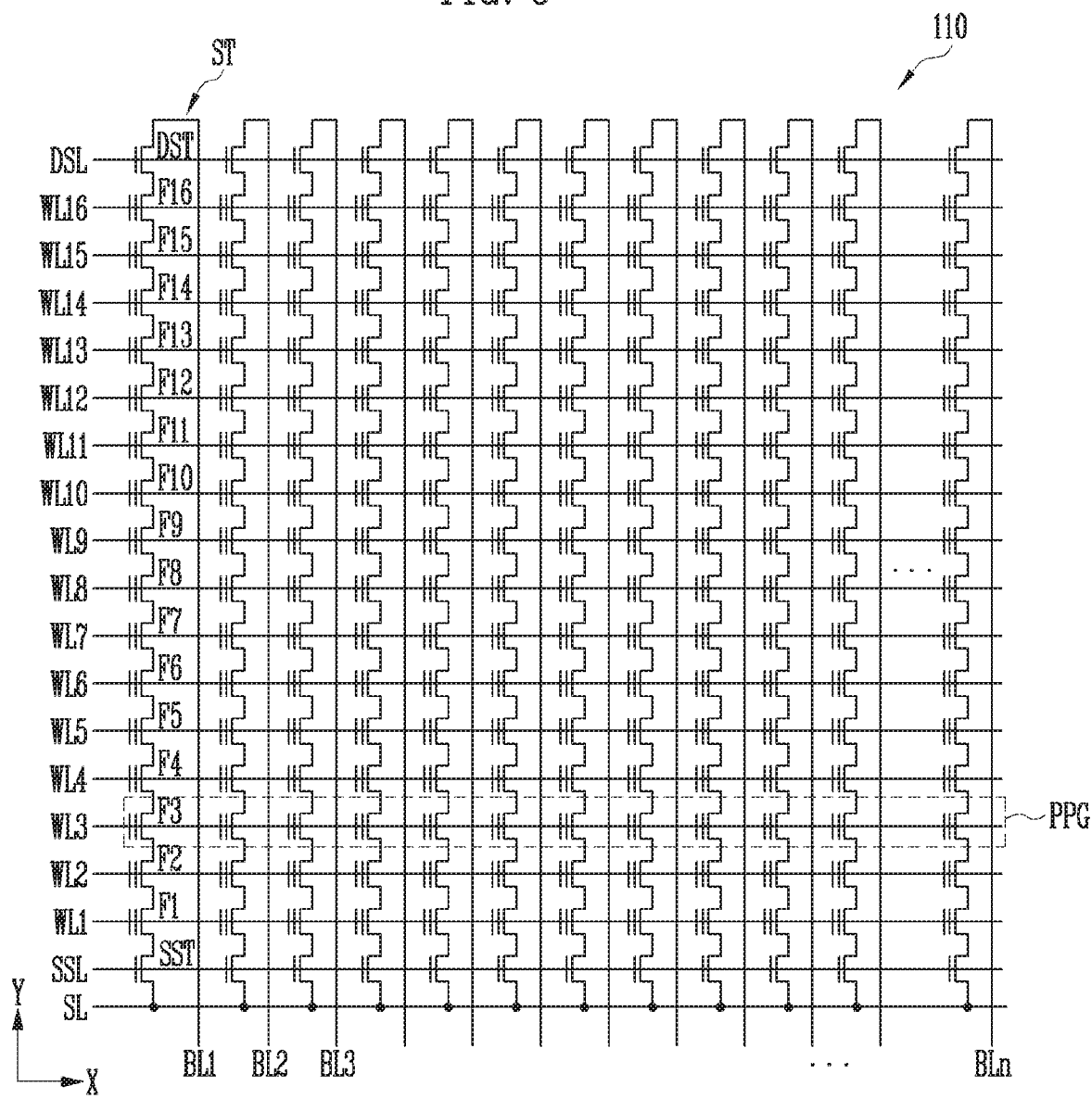
FIG. 3 is a diagram illustrating a memory block shown in FIG. 2.

FIG. 3 is a diagram illustrating a memory block shown in FIG. 2.

Referring to FIG. 3, in the memory block, a first select line, word lines, and a second select line, which are arranged in parallel, may be coupled to each other. For example, the word lines may be arranged in parallel between the first and second select lines. The first select line may be a source select line SSL, and the second select line may be a drain select line DSL.

Specifically, the memory block may include a plurality of strings coupled between bit lines BL1 to BLn and a source line SL. The bit lines BL1 to BLn may be respectively coupled to the strings, and the source line SL may be commonly coupled to the strings. The strings may be configured identically to one another, and therefore, a string ST coupled to a first bit line BL1 will be described in detail as an example.

The string ST may include a source select transistor SST, a plurality of memory cells F1 to F16, and a drain select transistor DAT, which are coupled in series to each other between the source line SL and the first bit line BL1. At least one source select transistor SST and at least one drain select transistor DST may be included in one string ST, and a number of memory cells greater than that of the memory cells F1 to F16 shown in the drawing may be included in the one string ST.

A source of the source select transistor SST may be coupled to the source line SL, and a drain of the drain select transistor DAT may be coupled to the first bit line BL1. The memory cells F1 to F16 may be coupled in series between the source select transistor SST and the drain select transistor DST. Gates of source select transistors SST included in different strings ST may be coupled to the source select line SSL, and gates of drain select transistors DST included in different strings ST may be coupled to the drain select line DSL. Gates of the memory cells F1 to F116 may be coupled to a plurality of word lines WL1 to WL16. A group of memory cells coupled to the same word line among memory cells included in different strings ST may be referred to as a physical page PPG. Therefore, physical pages corresponding to the number of the word lines WL1 to WL16 may be included in the memory block.

One memory cell may store data of one bit. The memory cell is generally referred to as a single level cell (SLC). For example, a single physical page PG may store data associated with a single logical page (LPG). The single LPG data may include a number of data bits which corresponds to the number of memory cells included in a single physical page PPG. Alternately, a single memory cell MC may store data of two or more bits. The memory cell is generally referred to as a multi-level cell. One physical page PPG may store two or more LPG data.

A memory cell storing data of two or more bits is referred to as the multi-level cell. A memory cell storing data of two bits may also be referred to as a MLC. A memory cell storing data of three or more bits is referred to as a triple level cell (TLC), and a memory cell storing data of four or more bits is referred to as a quadruple level cell (QLC).

Figure 4:
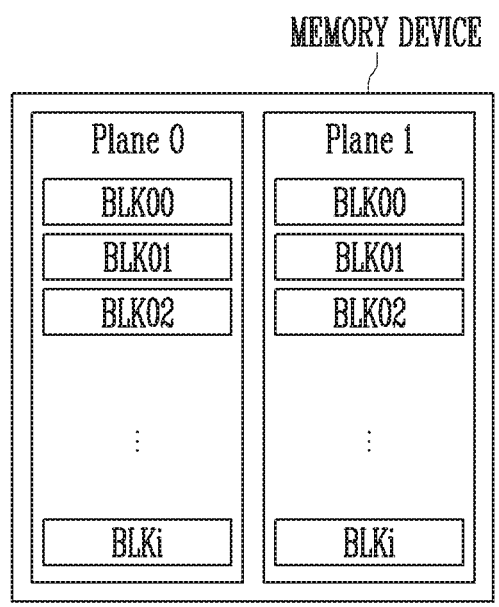
FIG. 4 is a diagram illustrating a plane structure of the memory device.

FIG. 4 is a diagram illustrating a plane structure of the memory device.

Referring to FIG. 4, the memory device may include a plurality of planes Plane 0, Plane 1. The number of planes included in the memory device is not limited to this embodiment. A single plane may include a plurality of memory blocks BLK00 to BLKi (i is a positive integer). The plane may be a group controlled independently to perform a program operation, a read operation or an erase operation. Therefore, the memory device may include the address decoder 121 and the read/write circuit 123, which are described with reference to FIG. 2, for each plane.

Figure 5:
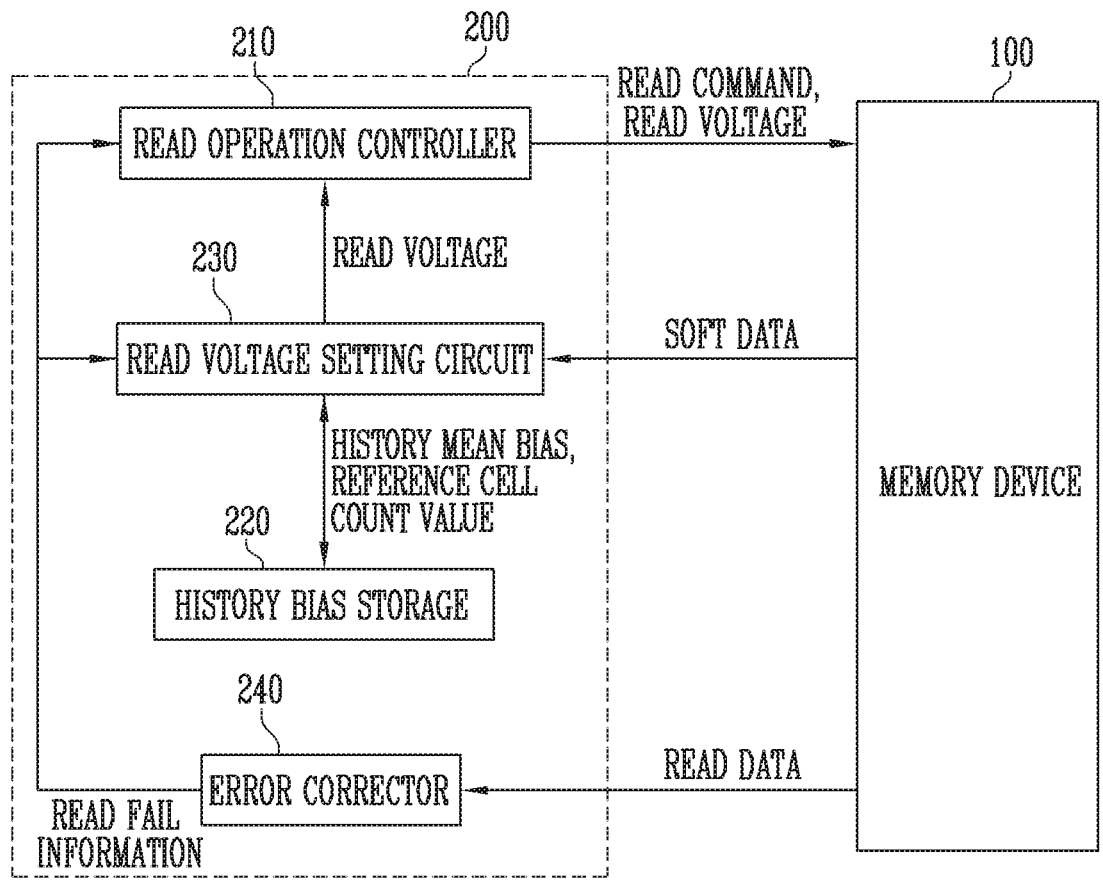
FIG. 5 is a diagram illustrating a configuration and an operation of a memory controller shown in FIG. 1.

FIG. 5 is a diagram illustrating a configuration and an operation of the memory controller shown in FIG. 1.

Referring to FIG. 5, the memory controller 200 may include a read operation controller 210, a history bias storage 220, a read voltage setting circuit 230, and an error corrector 240.

The read operation controller 210 may provide the memory device 100 with a read command for reading data stored in selected memory cells among the memory cells included in the memory device 100, information on a read voltage, and an address at which data to be read is stored. Specifically, the read operation controller 210 may provide the memory device 100 with a command for determining a read voltage applied to a selected word line to read the selected memory cells.

The read operation controller 210 may receive the read voltage to be applied to the selected word line from the read voltage setting circuit 230.

The read operation controller 210 may provide the memory device 100 with a read command for applying a default read voltage or an optimum read voltage to the selected word line to read data stored in memory cells coupled via the selected word line. The default voltage may be considered a read voltage determined in advance in a manufacturing process to read data. The optimum read voltage may be considered a read voltage newly set to read data, when a read operation using the default read voltage fails.

For example, when an operation of reading the selected word line based on the default read voltage fails, the read operation controller 210 may provide the memory device 100 with a read command instructing an operation of reading the selected word line by using the optimum read voltage.

The read operation controller 210 may receive, from the error corrector 240, read fail information representing whether a read operation has succeeded or failed. The read operation controller 210 may determine whether the read operation performed by the memory device 100 has succeeded or failed, through the read fail information.

The history bias storage 220 may store information on a plurality of history mean biases that are mean biases of a plurality of threshold voltage distributions that a plurality of memory cells have. The history bias storage 220 may provide the read voltage setting circuit 230 with the stored information on the history mean biases.

In an embodiment, the plurality of history mean biases may be considered mean biases of threshold voltage distributions that a plurality of memory cells have in a read operation that has most recently succeeded among read operations performed on the same plane or the same memory block.

For example, the plurality of history mean biases may correspond to a single memory block including a plurality of memory cells. Therefore, the history bias storage 220 may store history mean biases corresponding to each memory block. Alternatively, the plurality of history mean biases may correspond to a single plane including a plurality of memory cells. Therefore, the history bias storage 220 may store history mean biases corresponding to each plane.

The history bias storage 220 may receive, from the read voltage setting circuit 230, information regarding mean biases in distributions of threshold voltages that memory cells coupled to a selected word line has. The mean biases are calculated based on an optimum read voltage. The history bias storage 220 may update previously stored history mean biases, based on the mean biases in distributions of the threshold voltages provided from the read voltage storage 230, and store the updated history mean biases.

The history bias storage 220 may store a plurality of reference cell count values respectively corresponding to a plurality of history mean biases. The history bias storage 220 may provide the plurality of stored reference cell count values to the read voltage setting circuit 230.

The plurality of reference cell count values may be determined according to the number of selected memory cells coupled to a selected word line and the number of threshold voltage distributions corresponding to the plurality of history mean biases. The read voltage setting circuit 230 may provide the read operation controller 210 with information regarding a read voltage to be applied to the selected word line in a read operation.

The read voltage setting circuit 230 may receive, from the error corrector 240, read fail information representing whether a read operation has succeeded or failed. The read voltage setting circuit 230 may determine whether the read operation performed by the memory device 100 has succeeded or failed, through the read fail information.

The read voltage setting circuit 230 may determine an optimum read voltage, when a read operation using a default read voltage fails. The read voltage setting circuit 230 may determine an optimum read voltage by using a plurality of history mean biases or a soft read scheme.

The read voltage setting circuit 230 may compare cell count values that are the numbers of memory cells read as first memory cells by the plurality of history mean biases among memory cells coupled to the selected word line with a plurality of reference cell count values respectively corresponding to a plurality of history mean biases. The first memory cell may be any one of an on-cell and an off-cell.

A cell count value that is a number of memory cells read as the first memory cells may be a number of set logical values included in read data acquired from the memory device 100 by applying a history mean bias to a selected word line. When the first memory cell is an on-cell, the set logical value may be '1.' When the first memory cell is an off-cell, the set logical value may be '0.' Alternatively, when the first memory cell is an on-cell, the set logical value may be '0.' When the first memory cell is an off-cell, the set logical value may be '1.'

The read voltage setting circuit 230 may determine an optimum read voltage by using a plurality of history mean biases or a soft read scheme, based on a result obtained by comparing difference values between the cell count values that are the numbers of memory cells as the first memory cells and the plurality of reference cell count values with a threshold range.

When the difference values are within the threshold range, the read voltage setting circuit 230 may determine an optimum read voltage by using the plurality of history mean biases. The read voltage setting circuit 230 may determine an optimum read voltage through Gaussian modeling, based on history mean biases corresponding two adjacent threshold voltage distributions. A method for determining the optimum read voltage through the Gaussian modeling will be described below with reference to FIG. 11.

When the difference values are out of the threshold range, the read voltage setting circuit 230 may determine an optimum read voltage by using the soft read scheme.

The read voltage setting circuit 230 may acquire soft data obtained by reading selected memory cells coupled to a selected word line from the memory device 100, by applying a plurality of soft read voltages to the selected word line. The error corrector 240 may not perform error correction decoding on the soft data. The plurality of soft read voltages may be determined based on a reference read voltage. The reference read voltage may be considered a read voltage used in a read operation that fails, a default voltage, or a read voltage calculated based on history mean biases. The read voltage setting circuit 230 may determine an optimum read voltage, based on the acquired soft data. A method for determining an optimum read voltage by using the soft read scheme will be described below with reference to FIG. 11.

The read voltage setting circuit 230 may provide the read operation controller 210 with information regarding the determined optimum read voltage.

When a read operation using the optimum read voltage succeeds, the read voltage setting circuit 230 may update history mean biases stored in the history bias storage 220. The read voltage setting circuit 230 may update history mean biases by using mean biases of threshold voltage distributions that memory cells coupled to a selected word line have when the read operation succeeds.

For example, the read voltage setting circuit 230 may calculate mean biases of the threshold voltage distributions regarding the memory cells coupled to the selected word line when the read operation succeeds through the Gaussian modeling, based on the optimum read voltage. The read voltage setting circuit 230 may provide the history bias storage 220 with information regarding the calculated mean biases of the threshold voltage distributions.

The error corrector 240 may acquire, from the memory device 100, read data that is a result obtained by performing a read operation. The error corrector 240 may perform error correction decoding on the read data. When the number of fail bits included in the read data is equal to or smaller than that of bits correctable by the error corrector 240, the error correction decoding may succeed. When the number of fail bits included in the read data exceeds that of bits correctable by the error corrector 240, the error correction decoding may fail.

When the error correction decoding on the read data succeeds, the error corrector 240 may determine that the read operation performed by the memory device 100 has succeeded. When the error correction decoding on the read data fails, the error corrector 240 may determine that the read operation performed by the memory device 100 has failed.

The error corrector 240 may generate read fail information representing whether the read operation performed by the memory device 100 has succeeded or failed. The error corrector 240 may provide the generated read fail information to the read operation controller 210 and the read voltage setting circuit 230.

Figure 6:
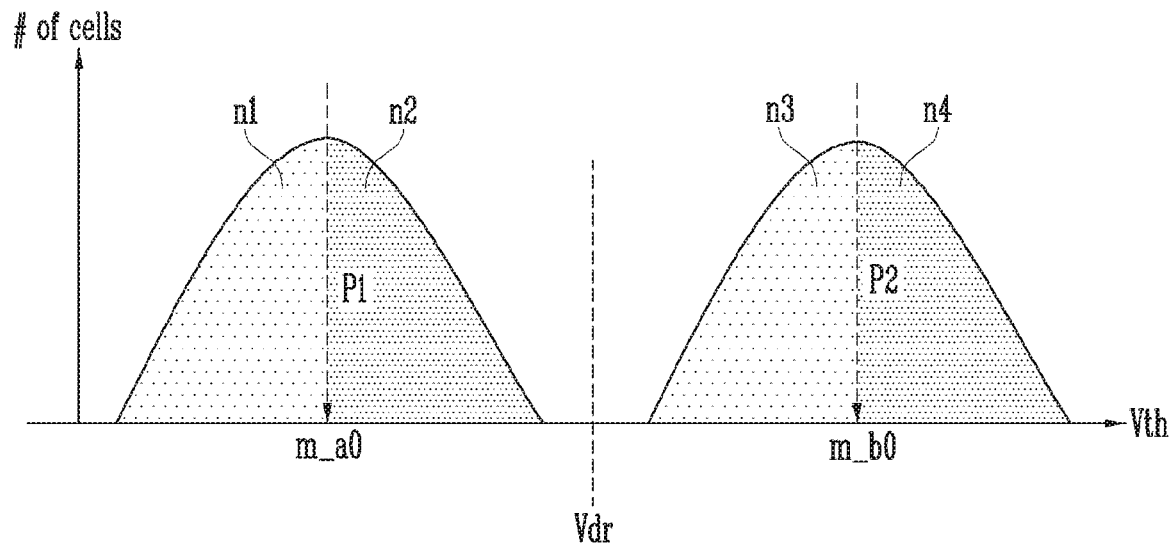
FIG. 6 is a diagram illustrating mean biases of threshold voltage distributions.

FIG. 6 is a diagram illustrating mean biases of threshold voltage distributions.

Referring to FIG. 6, memory cells may be programmed to have any state among an erase state and a plurality of program states. The memory cells may have an ideal state that is not influenced by disturbance or retention.

In FIG. 6, the memory cells may be programmed to any of a first state and a second state. The number of states to which the memory cells are programmed is not limited to this embodiment.

A default voltage Vdr may be an initial read voltage set in a manufacturing process to distinguish two adjacent states from each other. Memory cells programmed to the first state may belong to a first threshold voltage distribution P1. Memory cells programmed to the second state may belong to a second threshold voltage distribution P2.

A mean bias of a threshold voltage distribution may be considered a bias at which the largest number of memory cells among memory cells belonging to the threshold voltage distribution are located. In other words, the mean bias of the threshold voltage distribution may be considered a peak bias at which a number of memory cells belonging to the threshold voltage distribution is largest.

For example, the mean bias of the first threshold voltage distribution P1 may be m_a0. The mean bias of the second threshold voltage distribution P2 may be m_b0.

Reference cell count values may be determined based on the number of selected memory cells and the number of threshold voltage distributions that the memory cells have. A reference case where memory cells have an ideal threshold voltage distribution to which Gaussian modeling is applied is described. The reference cell count value is described based on an on-cell. In another embodiment, the reference cell count value may be described based on an off-cell.

In FIG. 6, when a number of the selected memory cells is 1000, a number of memory cells belonging to each of areas n1, n2, n3, n4 may be 250.

Therefore, a number of memory cells read as on-cells by the mean bias m_a0 of the first threshold voltage distribution P1 among memory cells coupled to a selected word line may be 250 that is the number of memory cells belonging to the area n1. A number of memory cells read as on-cells by the mean bias m_b0 of the second threshold voltage distribution P2 among the memory cells coupled to the selected word line may be 750 that is the number of memory cells belonging to the areas n1, n2, n3.

That is, a reference cell count value corresponding to the mean bias m_a0 of the first threshold voltage distribution P1 may be 250. A reference cell count value corresponding to the mean bias m_b0 of the second threshold voltage distribution P2 may be 750.

Figure 7:
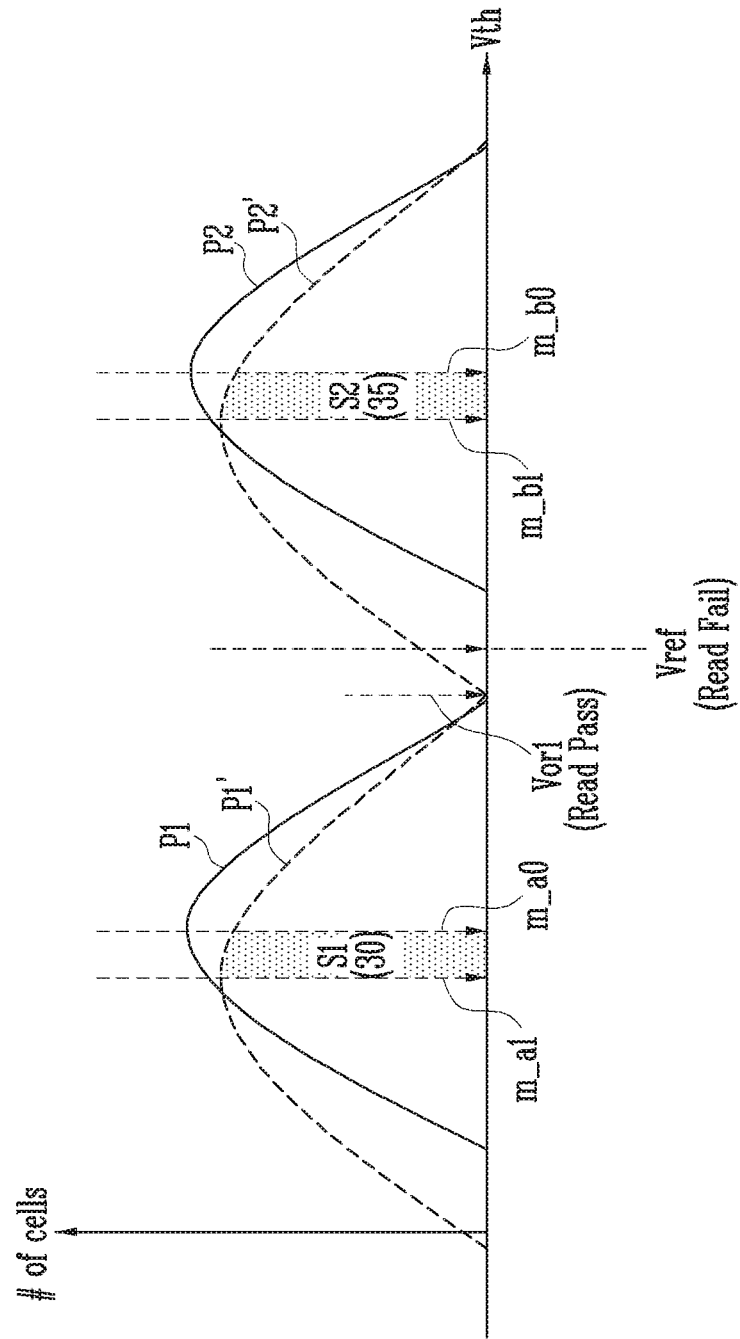
FIG. 7 is a diagram illustrating history mean biases and an optimum read voltage in accordance with an embodiment of the present disclosure.

FIG. 7 is a diagram illustrating history mean biases and an optimum read voltage in accordance with an embodiment of the present disclosure.

Referring to FIG. 7, a solid line may be a line illustrating an ideal threshold voltage distribution of memory cells. A dotted line may be a line illustrating a threshold voltage distribution of memory cells, which is influenced by disturbance or retention. That is, current threshold voltage distributions regarding memory cells, which are indicated by the dotted line, may be shifted to the left from initial threshold voltage distributions indicated by the solid line.

A threshold voltage distribution corresponding to a first state may be moved to the left from a threshold voltage distribution P1 to a threshold voltage distribution P1'. A threshold voltage distribution corresponding to a second state may be moved to the left from a threshold voltage distribution P2 to a threshold voltage distribution P2'.

History mean biases may be mean biases of threshold voltage distributions that memory cells have in a read operation that has most recently succeeded among read operation performed in the same memory block or the same plane.

For example, the threshold voltage distributions regarding the memory cells in the read operation that has most recently succeeded may be P1 and P2. Therefore, a history mean bias corresponding to the first state may be m_a0. A history mean bias corresponding to the second state may be m_b0.

A reference read voltage Vref may be a read voltage for distinguishing the first state and the second state from each other. When a read operation using the reference read voltage Vref fails, an optimum read voltage for distinguishing the first state and the second state from each other may be searched.

In FIG. 7, the current threshold voltage distributions regarding the memory cells may be P1' and P2'. Therefore, the optimum read voltage for distinguishing the first state and the second state from each other may be Vor1. A process of calculating the optimum read voltage will be described later with reference to FIG. 8.

FIG. 8 is a diagram illustrating the history mean biases shown in FIG. 7 and threshold range determination.

Referring to FIGS. 7 and 8, an optimum read voltage may be calculated by using a history mean bias according to whether a difference value between a cell count value obtained by reading selected memory cells coupled to a selected word line by applying the history mean bias to the selected word line and a reference cell count value is within a threshold range. The cell count value may be a number of memory cells read as first memory cells by the history mean bias among the selected memory cells. The first memory cell may be any one of an on-cell and an off-cell.

When the difference value between the cell count value and the reference cell count value is within the threshold range, a current threshold voltage distribution may be determined as a normal distribution, and an optimum read voltage may be calculated using the history mean bias. When the difference value between the cell count value and the reference cell count value is out of the threshold range, the current threshold voltage distribution may be determined as an abnormal distribution, and an optimum read voltage may be calculated using a soft read scheme which will be described later with reference to FIG. 11.

Specifically, the difference value between the cell count value and the reference cell count value may represent a movement tendency of a threshold voltage distribution. As the magnitude of the difference value become larger, the current threshold voltage distribution is considerably shifted based on a threshold voltage distribution when a recent read operation succeeded. Therefore, when the magnitude of the difference value is within the threshold range, it is predicted that the shift width of the threshold voltage distribution will be small, and the history mean bias has a high matching rate with the current threshold voltage distribution. Hence, an optimum read voltage may be calculated using the history mean bias. When the difference value is out of the threshold range, it is predicted that the shift width of the threshold voltage distribution will be large, and the history mean bias has a low matching rate with the current threshold voltage distribution. Hence, an optimum read voltage may be calculated using the soft read scheme.

In FIG. 7, the cell count value may be a number of memory cells read as on-cells among the selected memory cells by apply a history mean bias to the selected word line.

For example, a history mean bias corresponding to the first state may be m_a0. A history mean bias corresponding to the second state may be m_b0. A cell count value corresponding to the history mean bias m_a0 may be 280. A cell count value corresponding to the history mean bias m_b0 may be 785.

A difference value between the cell count value corresponding to the history mean bias m_a0 and the reference cell count value may be 30 that is the number of memory cells belonging to area S1 shown in FIG. 7. A difference value between the cell count value corresponding to the history mean bias m_b0 and the reference cell count value may be 35 that is the number of memory cells belonging to area S2 shown in FIG. 7.

A threshold range Th may be 25. In the case of each of the history mean biases m_a0, m_b0, the difference value between the cell count value and the reference cell count value may be out of the threshold range. This may mean that the current threshold voltage distribution is an abnormal distribution, and each of the history mean biases m_a0 and m_b0 has a low matching rate with the current threshold voltage distribution.

Therefore, a new optimum read voltage Vor1 may be calculated using a plurality of soft read voltages determined based on reference read voltages instead of the history mean biases m_a0, m_b0.

A read operation may pass as a result obtained by performing the read operation, using the optimum read voltage Vor1. Since history mean biases are mean biases of threshold voltage distributions that memory cells have in a read operation that has most recently succeeded, the history mean biases may be updated when the read operation passes.

A mean bias of the threshold voltage distribution P1' when the read operation passes may be m_a1, and a mean bias of the threshold voltage distribution P2' when the read operation passes may be m_b1. Therefore, a history mean bias corresponding to the first state may be updated from m_a0 to m_a1. A history mean bias corresponding to the second state may be updated from m_b0 to m_b1.

In various embodiments, mean biases of threshold voltage distributions when a read operation passes may be calculated through Gaussian modeling, based on an optimum read voltage used when the corresponding read operation passes. That is, the mean biases m_a1 and m_b1 of the threshold voltage distributions may be calculated through the Gaussian modeling, based on the optimum read voltage Vor1 used when the read operation passes.

Figure 9:
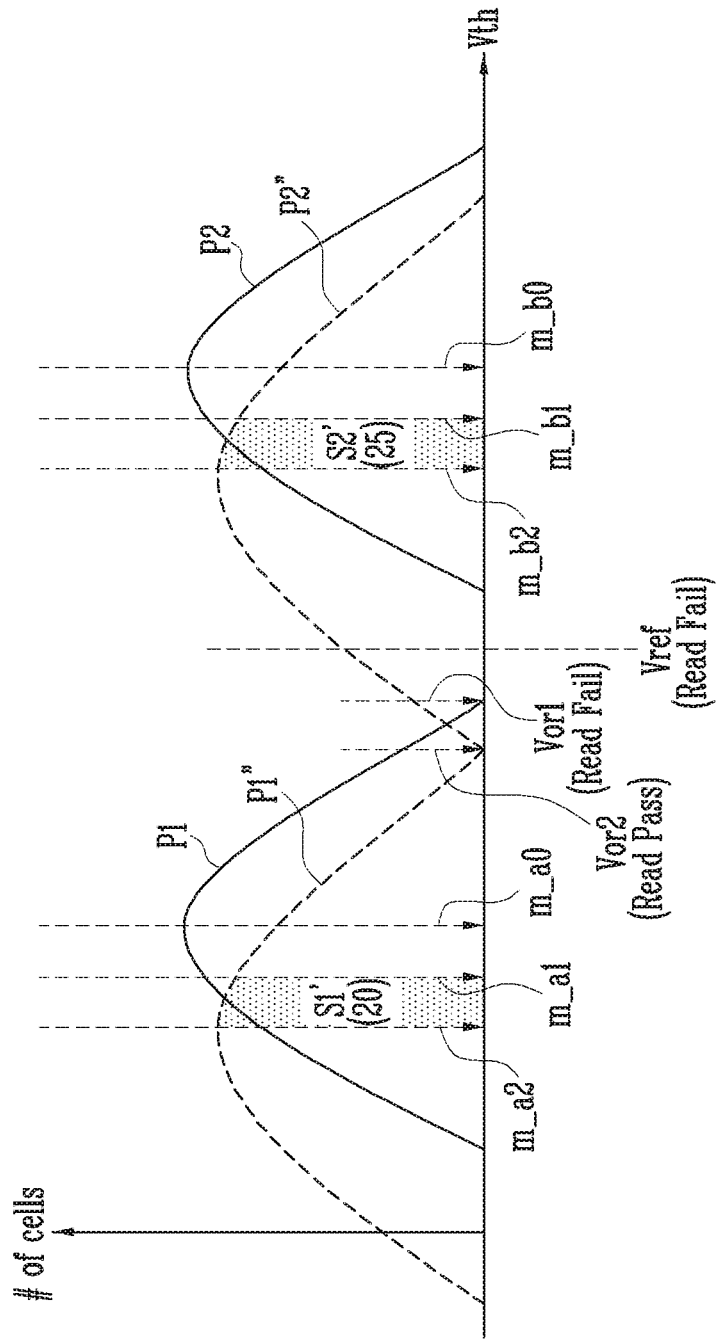
FIG. 9 is a diagram illustrating history mean biases and an optimum read voltage in accordance with another embodiment of the present disclosure.

FIG. 9 is a diagram illustrating history mean biases and an optimum read voltage in accordance with another embodiment of the present disclosure.

Referring to FIG. 9, as compared with FIG. 7, the threshold voltage distributions of the memory cells may be further shifted to the left. A current threshold voltage distribution corresponding to the first state may be moved from P1' to P1". A current threshold voltage distribution corresponding to the second state may be moved from P2' to P2".

In FIG. 9, an operation of reading a selected word line by applying a reference read voltage Vref to the selected word line may fail. The reference read voltage Vref may be a default read voltage which is set in advance to distinguish two adjacent states from each other. Alternatively, the reference read voltage Vref may be an optimum read voltage used in the previous read operation that passed.

When a difference value between a cell count value corresponding to each of history mean biases and the reference cell count value is within the threshold range, an optimum read voltage may be calculated using the history mean biases. The cell count value may be the number of memory cells read as first memory cells by the history mean bias among selected memory cells coupled to the selected word line. The first memory cell may be any one of an on-cell and an off-cell.

As will be described with reference to FIG. 10, in the case of both history mean biases m_a1, m_b1, the difference value between the cell count value and the reference cell count value is within the threshold range, and therefore, an optimum read voltage may be calculated using the history mean biases m_a1, m_b1.

The optimum read voltage calculated using the history mean biases m_a1, m_b1 may be Vor1. When a read operation using the optimum read voltage Vor1 fails, a new optimum read voltage may be calculated using a soft read scheme.

The new optimum read voltage calculated using the soft read scheme may be Vor2.

When a read operation passes as a result obtained by performing the read operation, using the new optimum read voltage Vor2, the history mean biases may be updated. A history mean bias corresponding to the first state may be updated from m_a1 to m_a2. A history mean bias corresponding to the second state may be updated from m_b1 to m_b2.

FIG. 10 is a diagram illustrating the history mean biases shown in FIG. 9 and threshold range determination.

Referring to FIGS. 9 and 10, a history mean bias corresponding to the first state may be m_a1. A history mean bias corresponding to the second state may be m_b1. A cell count value corresponding to the history mean bias m_a1 may be 270. A cell count value corresponding to the history mean bias m_b1 may be 775.

A difference value between the cell count value corresponding to the history mean bias m_a1 and the reference cell count value may be 20 that is a number of memory cells belonging to area S1' shown in FIG. 9. A difference value between the cell count value corresponding to the history mean bias m_b1 and the reference cell count value may be 25 that is a number of memory cells belonging to area S2' shown in FIG. 9.

A threshold range Th may be 25. In the case of each of the history mean biases m_a1, m_b1, the difference value between the cell count value and the reference cell count value may be within the threshold range. This may mean that the current threshold voltage distribution is a normal distribution, and each of the history mean biases m_a1, m_b1 has a high matching rate with the current threshold voltage distribution.

Therefore, an optimum read voltage may be calculated using the history mean biases m_a1, m_b1. Specifically, a mean value of history mean biases, each corresponding to each of two adjacent states, may be determined as an optimum read voltage for distinguishing the two adjacent states from each other. In FIG. 9, an optimum read voltage calculated using the history mean biases m_a1, m_b1 through Gaussian modeling may be Vor1.

A read operation may be ended based on a result obtained by performing the read operation, using an optimum read voltage calculated using history mean biases, or be again performed using an optimum read voltage calculated using a soft read scheme.

When the read operation using the calculated optimum read voltage passes, the read operation may be ended. When the read operation fails, the read operation may be again performed using the optimum read voltage calculated using the soft read scheme. When the read operation passes based on a result obtained by again performing the read operation, the history mean biases may be updated. When the read operation fails based on the result obtained by again performing the read operation, read fail processing may be made, and another data recovery algorithm may be performed.

The result obtained by performing the read operation, using the optimum read voltage Vor1 calculated using the history mean biases m_a1 and m_b1 may fail. Therefore, a new optimum read voltage Vor2 may be calculated using a plurality of read voltages.

A read operation may pass based on a result obtained by performing the read operation, using the optimum read voltage Vor2. When the read operation passes, the history mean biases may be updated.

A mean bias of the threshold voltage distribution P1" when the read operation passes may be m_a2, and a mean bias of the threshold voltage distribution P2" when the read operation passes may be m_b2. Therefore, the history mean bias corresponding to the first state may be updated from m_a1 to m_a2. The history mean bias corresponding to the second state may be updated from m_b1 to m_b2.

FIG. 11 is a diagram illustrating optimum read voltage calculation using a soft read scheme in accordance with an embodiment of the present disclosure.

Referring to FIG. 11, memory cells may be programmed to any one state among an erase state and a plurality of program states. In FIG. 11, a case where the memory cells are been programmed with any one of a first state and a second state is described.

A threshold voltage distribution corresponding to the first state may be P1. A threshold voltage distribution corresponding to the second state may be P2.

When a read operation using a reference read voltage fails, an optimum read voltage may be calculated using a plurality of soft read voltages Vsr1 to Vsr5 determined based on the reference read voltage Vref. Each of the plurality of soft read voltages Vsr1 to Vsr5 may be a read voltage obtained by adding an offset, based on the reference read voltage Vref. The offset may have a positive value or negative value.

In an embodiment, the reference read voltage Vref may be a read voltage used in a read operation that fails. A default read voltage may be an initial read voltage set to distinguish threshold voltage distributions regarding memory cells in a manufacturing process. In another embodiment, the reference read voltage Vref may be an optimum read voltage calculated using history mean biases. The history mean biases may be mean biases of threshold voltage distributions regarding memory cells in a read operation that has most recently succeeded. Therefore, a soft read operation using an optimum read voltage calculated using the history mean biases may be more efficient than that using the default read voltage.

An optimum read voltage may be determined based on interval cell count values obtained by counting numbers of memory cells belonging to intervals divided by a plurality of soft read voltages. Specifically, a soft read operation may be performed in a direction in which an interval cell count value is decreased, and a soft read voltage when the interval cell count value is smallest may be determined as the optimum read voltage.

An interval cell count value may be acquired based on a difference value between the numbers of is included in read data acquired using two adjacent soft read voltages. Alternatively, an interval cell count value may be acquired based on a difference value between the numbers of 0s included in read data acquired using two adjacent soft read voltages. The read data acquired using the soft read voltages may be soft data. Unlike normal read data, in the case of soft data, error correction decoding on the soft data may not be performed.

For example, when a read operation using the reference read voltage Vref fails, a soft read operation may be performed using the soft read voltage Vsr1 having a lower level than that of the reference read voltage Vref. Subsequently, a soft read operation may be performed using the soft read voltage Vsr2 having a higher level than that of the reference read voltage Vref.

As a result obtained by comparing an interval cell count value a1 and an interval cell count value a2, the interval cell count value a2 is less than the interval cell count value a1, and therefore, it may be predicted that the optimum read voltage will be located at the right from the reference read voltage Vref. In other words, it may be predicted that the optimum read voltage will have a higher level than that of the reference read voltage Vref.

When a position of the optimum read voltage is determined, a soft read operation may be performed using soft read voltages obtained by adding an offset in the corresponding direction.

Therefore, in FIG. 11, each of the soft read voltages Vsr3 to Vsr5 may be a value obtained by adding a positive offset, as compared with the reference read voltage Vref.

In the same manner described above, interval cell count values a3 to a5 may be calculated through soft reading. The interval cell count value may be decreased toward a4 from a3. The interval cell count value may be increased toward a5 from a4, Therefore, since the interval cell count value a4 is smallest, the soft read voltage Vsr4 corresponding to the interval cell count value a4 may be calculated as the optimum read voltage.

In an embodiment, magnitudes of offsets offset1 to offset5 may all be the same. In various embodiments, when a soft read operation is performed in an order from the offset offset1 to the offset offset5, the magnitude of the offset may be gradually decreased. Therefore, the soft read operation may be rapidly performed by increasing the offset with a wide variation at an early stage of the soft read operation, and an optimum read voltage may be precisely calculated by increasing the offset with a narrow variation at a late stage of the soft read operation.

FIG. 12 is a diagram illustrating the history bias storage shown in FIG. 5 in accordance with an embodiment of the present disclosure.

Referring to FIG. 12, the history bias storage 220 may store a history mean bias corresponding to each memory block.

When a memory operation is formed on selected memory cells among memory cells included in one memory block, threshold voltage distributions regarding unselected memory cells among the memory cells included in the one memory block may be influenced. The memory operation may be a read operation, a program operation or an erase operation. An interference effect between memory cells is referred to as disturbance. A threshold voltage distribution of memory cells influenced by the disturbance may be shifted to the right while charges are being charged in a trap region of each memory cell.

When the memory operation is not performed on memory cells included in a memory block during a long period of time, a threshold voltage distribution of the memory cells may be shifted to the left while charges charged in a trap region of each memory cell are being discharged. This phenomenon is referred to as retention.

Due to such a characteristic, it may be predicted that threshold voltage distributions regarding memory cells included in one memory block will have a similar shift tendency. Therefore, a history mean bias may be commonly used with respect to a plurality of word lines included in a memory block, regardless of the position of each word line.

For example, when a read operation on a first word line of a memory block passes, a history mean bias may be stored. When a read operation on a second word line different from the first word line, which is included in the same memory block, fails, an optimum read voltage may be determined using the history mean bias that was previously stored.

For example, when a read operation on memory cells different from selected memory cells succeeds, mean biases of threshold voltage distributions regarding the memory cells different from the selected memory cells may be stored as a plurality of history mean biases. Alternatively, when a read operation on the selected memory cells succeeds, mean biases of threshold voltage distributions regarding the selected memory cells may be stored as a plurality of history mean biases. When a read operation on next selected memory cells fails, an optimum read voltage for reading the selected memory cells may be determined based on the plurality of history mean biases that were previously stored.

In FIG. 12, one memory device may include planes PL1, PL2. The plane PL1 may include memory blocks BLK1, BLK2. The plane PL2 may include memory blocks BLK3, BLK4. The number of planes included in one memory device and the number of memory blocks included in one plane are not limited to this embodiment.

In FIG. 12, a memory cell of a memory block may be a multi-level cell which has a capability of storing two-bit data. Therefore, the memory cell may be programmed to any one state among an erase state and first to third different program states. A first threshold voltage distribution may correspond to the erase state. A second threshold voltage distribution may correspond to the first program state. A third threshold voltage distribution may correspond to the second program state. A fourth threshold voltage distribution may correspond to the third program state.

History mean biases corresponding to the memory block BLK1 may be shown as m_11, m_21, m_31, m_41. The m_11 may be a mean bias of the first threshold voltage distribution. The m_21 may be a mean bias of the second threshold voltage distribution. The m_31 may be a mean bias of the third threshold voltage distribution. The m_41 may be a mean bias of the fourth threshold voltage distribution.

In this manner, history mean biases corresponding to the memory block BLK2 may be m_12, m_22, m_32, m_42. History mean biases corresponding to the memory block BLK3 may be m_13, m_23, m_33, m_43. History mean biases corresponding to the memory block BLK4 may be m_14, m_24, m_34, m_44.

The history bias storage 220 may store a reference cell count value.

The reference cell count value may be determined based on the number of selected memory cells and the number of threshold voltages distributions.

For example, a case where the number of memory cells coupled to each word line included in a memory block is 1000 is described. When each memory cell of the memory block is a multi-level cell storing two data bits, the number of threshold voltage distributions may be 4.

Therefore, in the case of an ideal threshold voltage distribution, a number of memory cells belonging to each threshold voltage distribution may be 250. 125 cells among the memory cells belonging to each threshold voltage distribution may be read as on-cells by a mean bias of each threshold voltage distribution, and the other 125 cells may be read by off-cells by the a mean bias of each threshold voltage distribution.

The reference cell count value may be the number of memory cells read as on-cells by a mean bias of each corresponding threshold voltage distribution among memory cells coupled to a selected word line. In another embodiment, the reference cell count value may be the number of memory cells read as off-cells by a mean bias of each corresponding threshold voltage distribution among the memory cells coupled to the selected word line.

Therefore, the number of memory cells read as on-cells among the memory cells coupled to the selected word line by the mean bias of the first threshold voltage distribution may be 125. The number of memory cells read as on-cells among the memory cells coupled to the selected word line by the mean bias of the second threshold voltage distribution may be 375. The number of memory cells read as on-cells among the memory cells coupled to the selected word line by the mean bias of the third threshold voltage distribution may be 625. The number of memory cells read as on-cells among the memory cells coupled to the selected word line by the mean bias of the fourth threshold voltage distribution may be 875.

FIG. 13 is a diagram illustrating the history bias storage shown in FIG. 5 in accordance with another embodiment of the present disclosure.

Referring to FIG. 13, as compared with FIG. 12, the history bias storage 220 may store a history mean bias corresponding to a plane including memory blocks.

That is, the history mean bias may be commonly used with respect to all word lines included in each of the memory blocks included in the plane. Therefore, reliability may be worse than that when a history mean bias is stored and used for each memory block in FIG. 12. However, an amount of data about history mean biases to be stored can be reduced.

History mean biases corresponding to the plane PL1 may be m_11', m_21', m_31', m_41'. The m_11' may be a mean bias of the first threshold voltage distribution. The m_21' may be a mean bias of the second threshold voltage distribution. The m_31' may be a mean bias of the third threshold voltage distribution. The m_41' may be a mean bias of the fourth threshold voltage distribution.

In this manner, mean biases corresponding to the plane PL2 may be m_12', m_22', m_32', m_42'.

The history bias storage 220 may store a reference cell count value in the same manner as described with reference to FIG. 12.

Figure 14:
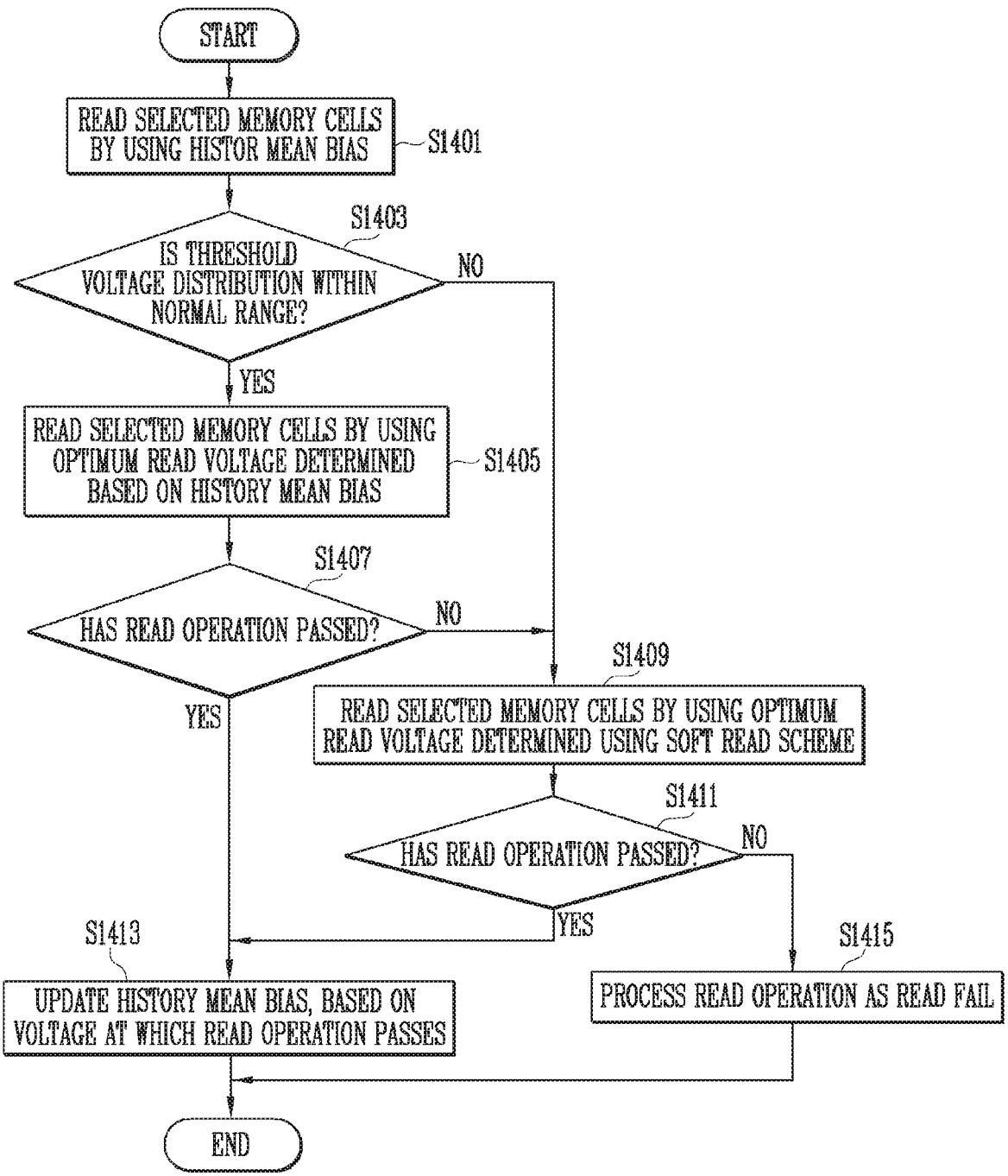
FIG. 14 is a flowchart illustrating an operation of the storage device in accordance with an embodiment of the present disclosure.

FIG. 14 is a flowchart illustrating an operation of the storage device in accordance with an embodiment of the present disclosure.

Referring to FIG. 14, the storage device may include a memory device including a plurality of memory cells and a memory controller configured to control the memory device.

In step S1401, when a read operation on selected memory cells fails, the storage device may read the selected memory cells by using a history mean bias.

In step S1403, the storage device may determine whether a threshold voltage distribution is within a normal range, based on read data acquired using the history mean bias. When the threshold voltage distribution is within the normal range, based on the determination result, the storage device proceeds to step S1405. When the threshold voltage distribution is out of the normal range, based on the determination result, the storage device proceeds to step S1409.

In the step S1405, the storage device may read the selected memory cells by using an optimum read voltage determined based on the history mean bias.

In step S1407, the storage device may determine success and failure regarding a read operation using the optimum read voltage determined based on the history mean bias. Specifically, the storage device may perform error correction decoding on read data acquired using the optimum read voltage, and determine whether the read operation has passed or failed based on a result obtained by performing the error correction decoding. When the read operation passes, the storage device proceeds to step S1413. When the read operation fails, the storage device proceeds to the step S1409.

In step S1409, the storage device may determine an optimum read voltage by using a soft read scheme.

In step S1411, the storage device may determine success and failure regarding a read operation using the optimum read voltage determined based on the soft read scheme. When the read operation passes, the storage device proceeds to step S1413. When the read operation fails, the storage device proceeds to step S1415.

In step S1413, the storage device may update the history mean bias by using mean biases of threshold voltage distributions when the read operation passes. The storage device may calculate the mean biases of the threshold voltage distributions when the read operation passes through Gaussian modeling, based on a voltage at which the read operation passes.

In step S1415, when the read operation using the optimum read voltage fails, the storage device may process the read operation as read fail. The storage device may perform a separate data recovery algorithm such as a read retry operation performed when the read operation fails.

Figure 15:
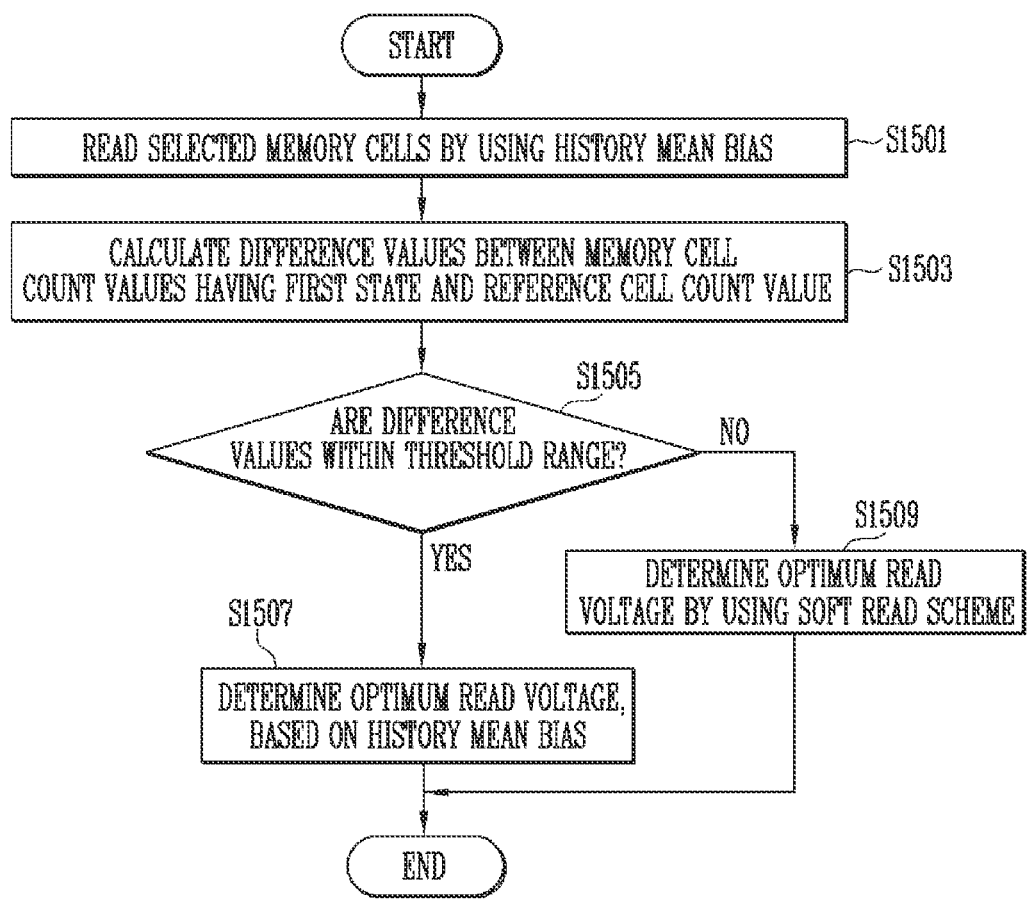
FIG. 15 is a flowchart illustrating in detail an operation of determining an optimum read voltage, which is shown in FIG. 14.

FIG. 15 is a flowchart illustrating in detail an operation of determining an optimum read voltage, which is shown in FIG. 14.

Referring to FIG. 15, in step S1501, when a read operation fails, the storage device may apply a history mean bias to a selected word line, and read memory cells coupled to the selected word line.

In step S1503, the storage device may calculate difference values between count values, i.e., the numbers of memory cells read as first memory cells, and a reference cell count value, based on a result obtained by performing the read operation. The first memory cell may be any one of an on-cell and an off-cell.

In step S1505, the storage device may determine whether the difference values are within a threshold range. When the difference values are within the threshold range, the storage device proceeds to step S1507. When the difference values are out of the threshold range, the storage device proceeds to step S1509.

In step S1507, the storage device may determine an optimum read voltage through Gaussian modeling, based on a history mean bias corresponding to two adjacent threshold voltage distributions. A read voltage used in the failed read operation may be used for distinguishing the two adjacent threshold voltage distributions from each other.

In step S1509, the storage device may determine an optimum read voltage by using the soft read scheme. The storage device may determine an optimum read voltage, based on soft data acquired using a plurality of soft read voltages determined based on a reference read voltage. The reference read voltage may be calculated based on a read voltage used in a read operation, a default read voltage, or a history mean bias. The default read voltage may be a voltage set to distinguish threshold voltage distributions regarding memory cells in a manufacturing process.

Figure 16:
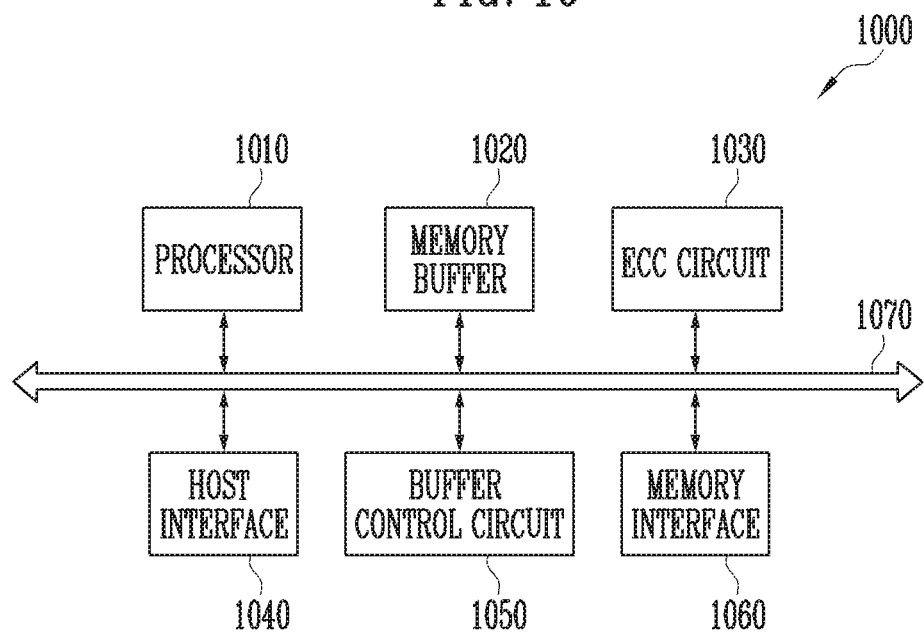
FIG. 16 is a diagram illustrating another embodiment of the memory controller shown in FIG. 1.

FIG. 16 is a diagram illustrating another embodiment of the memory controller shown in FIG. 1.

Referring to FIG. 16, the memory controller 1000 is coupled to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide data paths such as channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. The FTL may utilize several address mapping methods, according to mapping schemes. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

In an embodiment, the memory buffer 1020 may include the history bias storage 220 shown in FIG. 1.

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory, ROM) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 17:
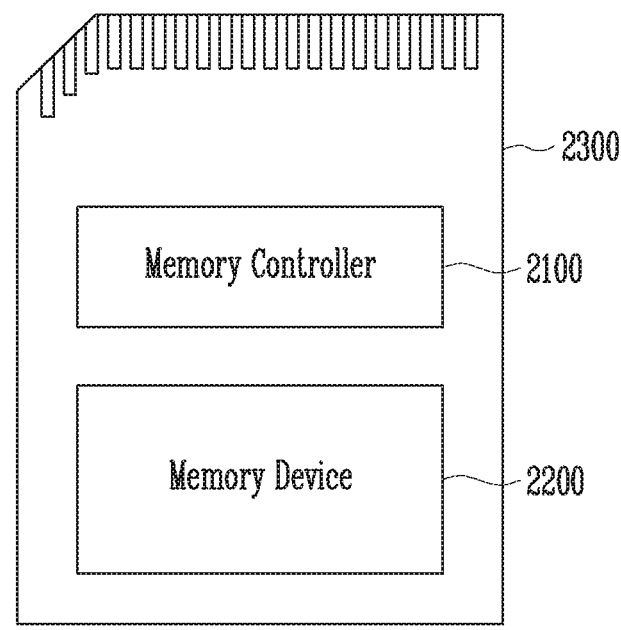
FIG. 17 is a block diagram illustrating a memory card system to which the storage device is applied in accordance with an embodiment of the present disclosure.

FIG. 17 is a block diagram illustrating a memory card system to which the storage device is applied in accordance with an embodiment of the present disclosure.

Referring to FIG. 17, the memory card system 2000 includes a memory controller 2100, a memory device, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory controller 2100 may be implemented identically to the memory controller 200 described with reference to FIG. 1.

In an example, the memory controller 2100 may include components such as a Random Access Memory (RAM), a processing unit, a host interface, a memory interface, and an ECC circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (DATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 18:
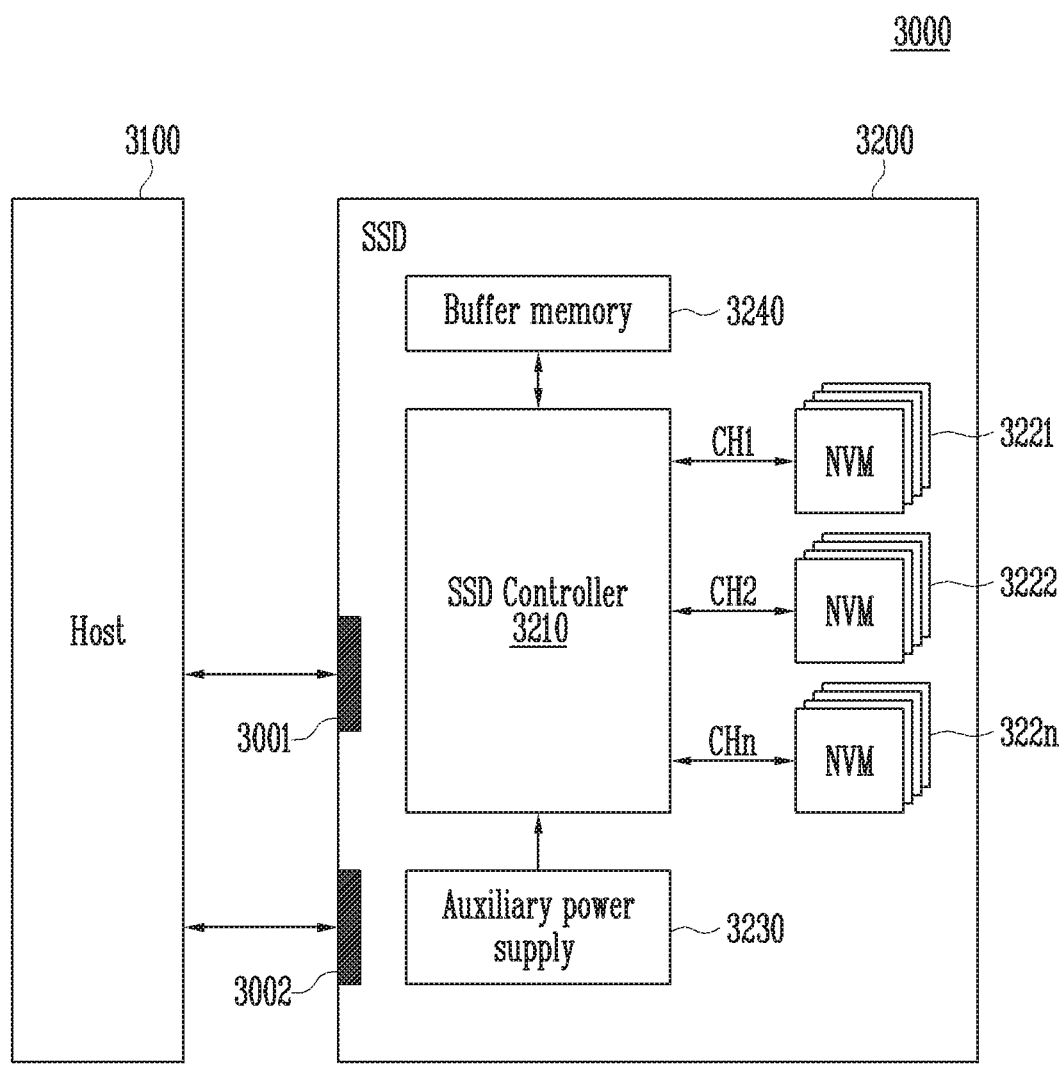
FIG. 18 is a block diagram exemplarily illustrating a solid state drive (SSD) system to which the storage device is applied in accordance with an embodiment of the present disclosure.

FIG. 18 is a block diagram exemplarily illustrating a Solid State Drive (SSD) system to which the storage device is applied in accordance with an embodiment of the present disclosure.

Referring to FIG. 18, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power to the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 19:
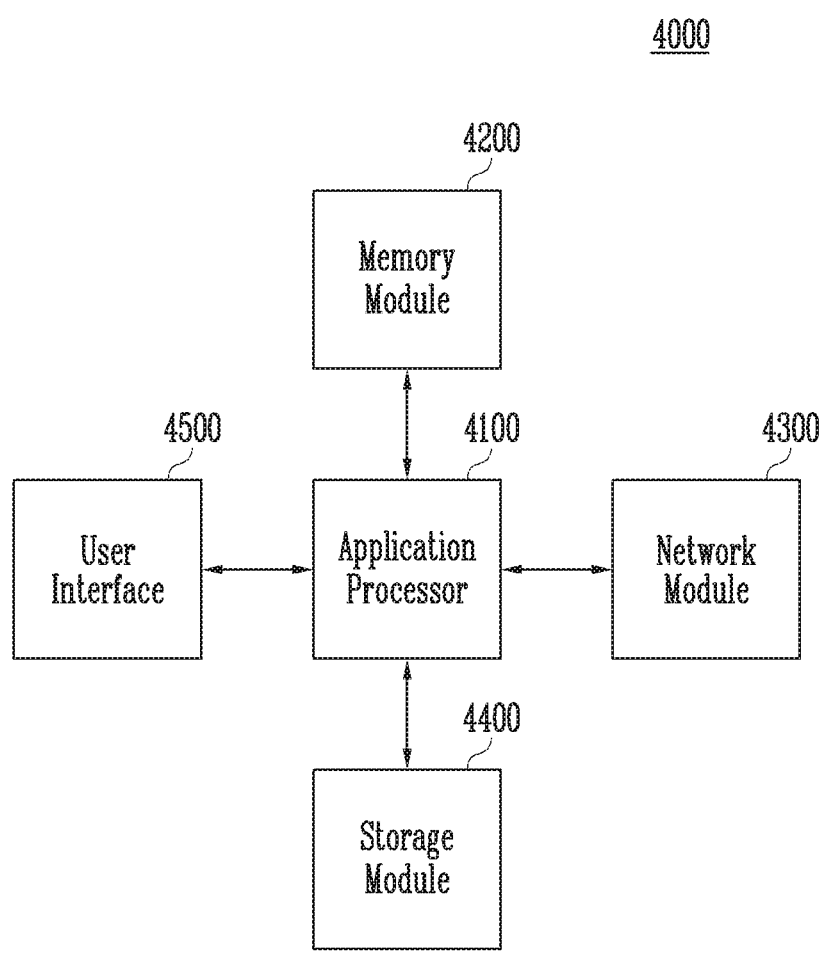
FIG. 19 is a block diagram illustrating a user system to which the storage device is applied in accordance with an embodiment of the present disclosure.

FIG. 19 is a block diagram illustrating a user system to which the storage device is applied in accordance with an embodiment of the present disclosure.

Referring to FIG. 19, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with an embodiment of the present disclosure, there can be provided a storage device having improved read performance and an operating method thereof.

While various embodiments of the invention have been illustrated and described, those skilled in the art will understand based on the present disclosure that various changes in form and details may be made therein without departing from the spirit and scope of the present invention as defined by the appended claims and their equivalents. Therefore, the scope of the present invention is not limited to the above-described embodiments; rather, the scope of the present invention is determined the appended claims their equivalents.

In the above-described embodiments, in some instances, not all steps or operations need be performed, and steps or operations may combined or performed in a different order than described. The disclosed embodiments are intended to facilitate an understanding of the present invention, not to limit it.

Although specific terminologies are used herein, they are used only to explain embodiments of the present invention, not to restrict it. Many variations and modifications are possible within the spirit and scope of the present invention. All such variations and modifications that fall within the scope of the claims are encompassed by the present invention.

What is claimed is:

1. A memory controller for controlling a memory device including a plurality of memory cells, the memory controller comprising:
   a read operation controller configured to read data stored in selected memory cells among the plurality of memory cells;
   a history bias storage configured to store a plurality of history mean biases, which are mean biases of a plurality of threshold voltage distributions that the plurality of memory cells have, and a plurality of reference cell count values, respectively corresponding to the plurality of threshold voltage distributions; and
   a read voltage setting circuit configured to calculate difference values between cell count values and the plurality of reference cell count values, when the read operation fails, and determine an adjusted read voltage to read the selected memory cells, based on the plurality of history mean bias, according to whether the difference values are within a threshold range,
   wherein the cell count values are numbers of memory cells read as first memory cells by the plurality of history mean biases among the selected memory cells, and
   wherein the plurality of reference cell count values is determined based on a number of the selected memory cells and a number of the plurality of threshold voltage distributions.

2. The memory controller of claim 1, wherein, when the read operation fails, the read operation controller controls the memory device to read the selected memory cells by using the plurality of history mean biases.

3. The memory controller of claim 1, wherein the read operation controller controls the memory device to read the selected memory cells by using the adjusted read voltage.

4. The memory controller of claim 1, wherein the first memory cell is an on-cell or an off-cell.

5. The memory controller of claim 1, wherein the history bias storage stores, as the plurality of history mean biases, mean biases of threshold voltage distributions regarding the plurality of memory cells in a read operation that has most recently succeeded.

6. The memory controller of claim 5, wherein the selected memory cells are memory cells different from memory cells on which the read operation that has most recently succeeded is performed among the plurality of memory cells.

7. The memory controller of claim 1, wherein the history bias storage stores information on the plurality of history mean biases corresponding to a memory block including the plurality of memory cells.

8. The memory controller of claim 1, wherein the history bias storage stores information on the plurality of history mean biases corresponding to a plane including the plurality of memory cells.

9. The memory controller of claim 1, wherein, when the difference values are within the threshold range, the read voltage setting circuit determines the adjusted read voltage through Gaussian modeling, based on the plurality of history mean biases.

10. The memory controller of claim 1, wherein, when the difference values are out of the threshold range, the read voltage setting circuit determines the adjusted read voltage, using soft data obtained by reading the selected memory cells by using a plurality of soft read voltages determined based on a reference read voltage.

11. The memory controller of claim 10, wherein the reference read voltage is a read voltage used in the read operation or a read voltage calculated through Gaussian modeling, based on the plurality of history mean biases.

12. The memory controller of claim 1, further comprising an error corrector configured to perform error correction decoding on read data acquired from the memory device according to the read operation, and generate read fail information representing whether the read operation has failed, based on a result obtained by performing the error correction decoding.

13. A method for operating a storage device including a memory device including a plurality of memory cells and a memory controller for controlling the memory device, the method comprising:
   storing information on a plurality of history mean biases that are mean biases of a plurality of threshold voltage distributions that the plurality of memory cells have;
   performing a read operation on selected memory cells among the plurality of memory cells;
   comparing cell count values with a plurality of reference cell count values respectively corresponding to the plurality of threshold voltage distributions, when the read operation fails; and
   determining an adjusted read voltage, based on the plurality of history mean biases, according to whether difference values between the cell count values and the plurality of reference cell count values are within a threshold range,
   wherein the cell count values are numbers of memory cells read as first memory cells by the plurality of history mean biases among the selected memory cells, and
   wherein the plurality of reference cell count values is determined based on a number of the selected memory cells and a number of the plurality of threshold voltage distributions.

14. The method of claim 13, wherein the comparing includes reading the selected memory cells by using the plurality of history mean biases, when the read operation fails.

15. The method of claim 13, further comprising reading the selected memory cells by using the adjusted read voltage.

16. The method of claim 13, wherein, in the storing, mean biases of threshold voltage distributions regarding the plurality of memory cells in a read operation that has most recently succeeded are stored as the plurality of history mean biases.

17. The method of claim 13, wherein, in the determining, the adjusted read voltage is determined through Gaussian modeling, based on the plurality of history mean biases, when the difference values are within the threshold range.

18. The method of claim 13, wherein, in the determining, the adjusted read voltage is determined using soft data obtained by reading the selected memory cells by using a plurality of soft read voltages determined based on a reference read voltage, when the difference values are out of the threshold range,
wherein the reference read voltage is a read voltage used in the read operation or a read voltage calculated based on the plurality of history mean biases.

19. The method of claim 13, wherein the first memory cell is an on-cell or an off-cell.

20. The method of claim 13, wherein the plurality of history mean biases correspond to a memory block including the plurality of memory cells or a plane including the plurality of memory cells.

* * * * *